(12) United States Patent
Zimmermann

(10) Patent No.: US 7,511,901 B2
(45) Date of Patent: Mar. 31, 2009

(54) MICRO-OPTIC ALIGNMENT SYSTEM

(76) Inventor: Micha Zimmermann, 6 Hatzofim St., Haifa 34352 (IL)

(*) Notice: Subject to any disclaimer, the term of this patent is extended or adjusted under 35 U.S.C. 154(b) by 162 days.

(21) Appl. No.: 10/562,981

(22) PCT Filed: Jun. 29, 2004

(86) PCT No.: PCT/IL2004/000576

§ 371 (c)(1),
(2), (4) Date: Dec. 28, 2005

(87) PCT Pub. No.: WO2005/002004

PCT Pub. Date: Jan. 6, 2005

(65) Prior Publication Data

US 2006/0146425 A1      Jul. 6, 2006

Related U.S. Application Data

(60) Provisional application No. 60/483,536, filed on Jun. 30, 2003.

(51) Int. Cl.
G02B 7/02 (2006.01)

(52) U.S. Cl. ....................................... 359/819

(58) Field of Classification Search ......... 351/819–823, 351/483–485, 494–498; 359/819–823, 483–485, 359/494–498
See application file for complete search history.

(56) References Cited

U.S. PATENT DOCUMENTS

| | | | |
|---|---|---|---|
| 4,989,940 A | 2/1991 | Wollenweber et al. | 385/35 |
| 5,808,793 A * | 9/1998 | Chang et al. | 359/484 |
| 6,081,635 A * | 6/2000 | Hehmann | 385/24 |
| 6,157,502 A * | 12/2000 | Kathman | 359/819 |
| 6,430,337 B1 | 8/2002 | Bergmann et al. | 385/25 |
| 6,775,076 B2 * | 8/2004 | Do et al. | 359/819 |

* cited by examiner

Primary Examiner—Mohammed Hasan
(74) Attorney, Agent, or Firm—Nixon Peabody LLP

(57) ABSTRACT

Optical alignment apparatus, consisting of an optical element (28) having a curved surface (29), and an optical bench (22), including a mounting surface (21) for mounting of an optical component (24, 44) thereon. The optical bench has an opening (26) formed in the mounting surface, the opening having a size and shape suitable to engage the curved surface of the optical clement so as to permit alignment of the optical element with the optical component by relative rotation of the optical element within the opening while the curved surface is engaged by the opening.

17 Claims, 10 Drawing Sheets

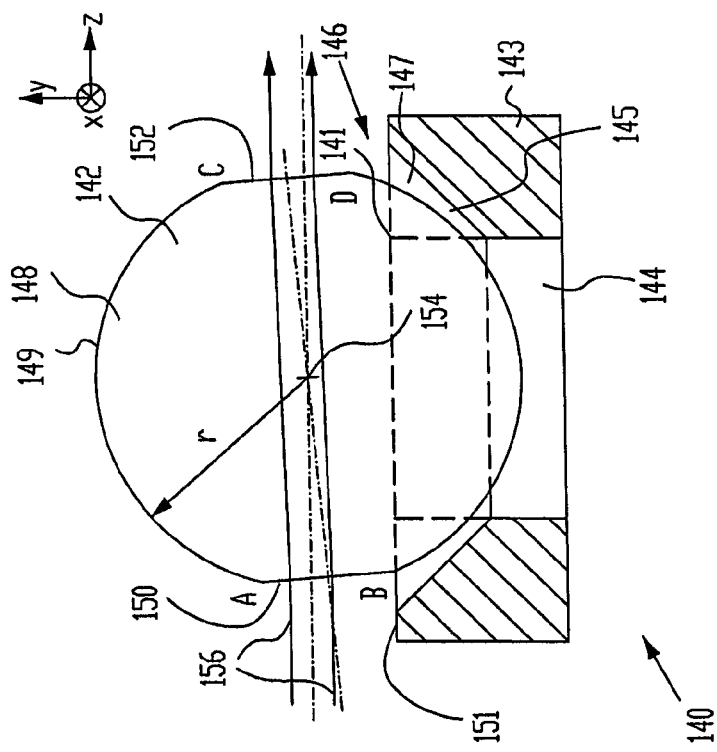
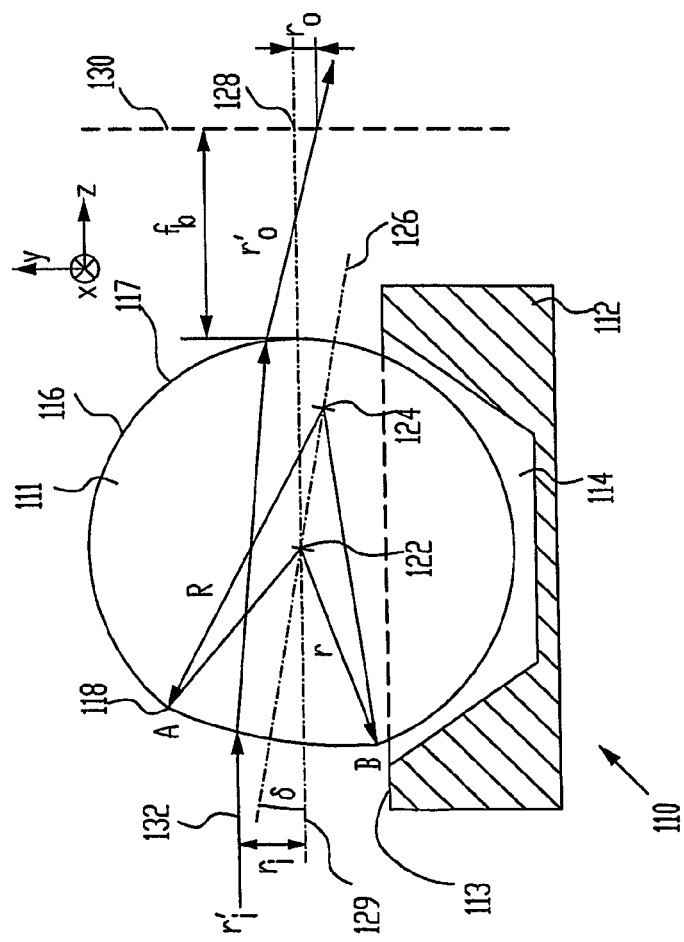
FIG. 3
FIG. 4

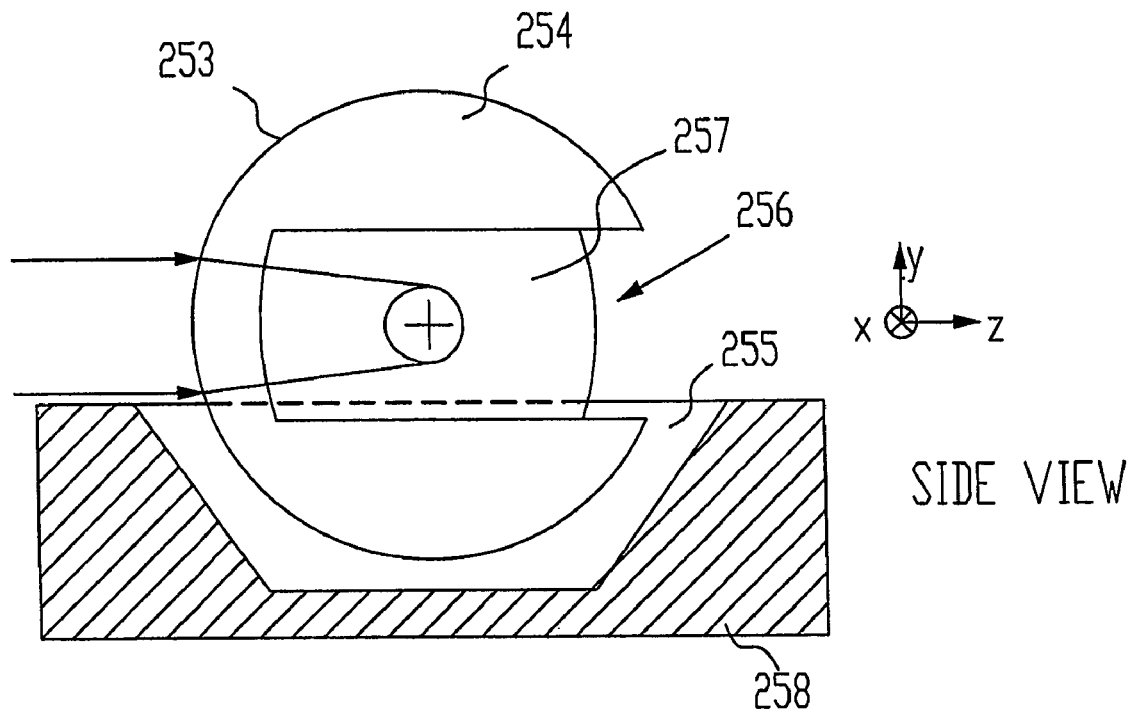
SIDE VIEW
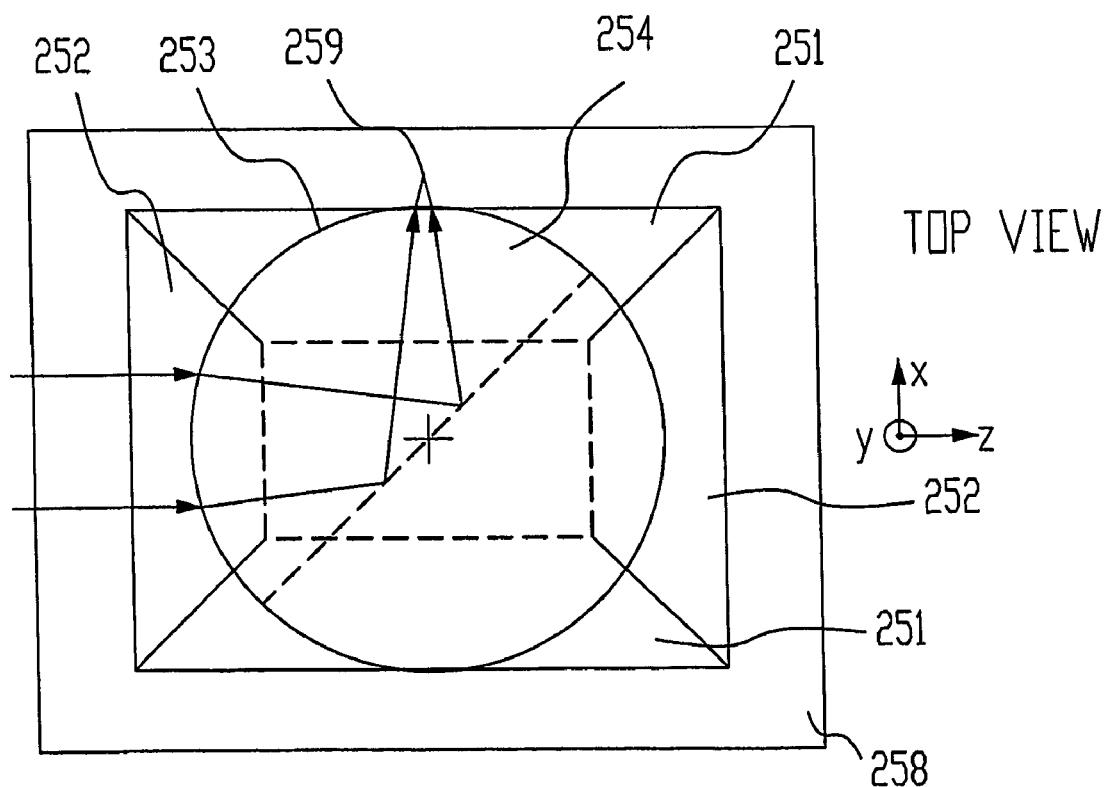
TOP VIEW
FIG. 8

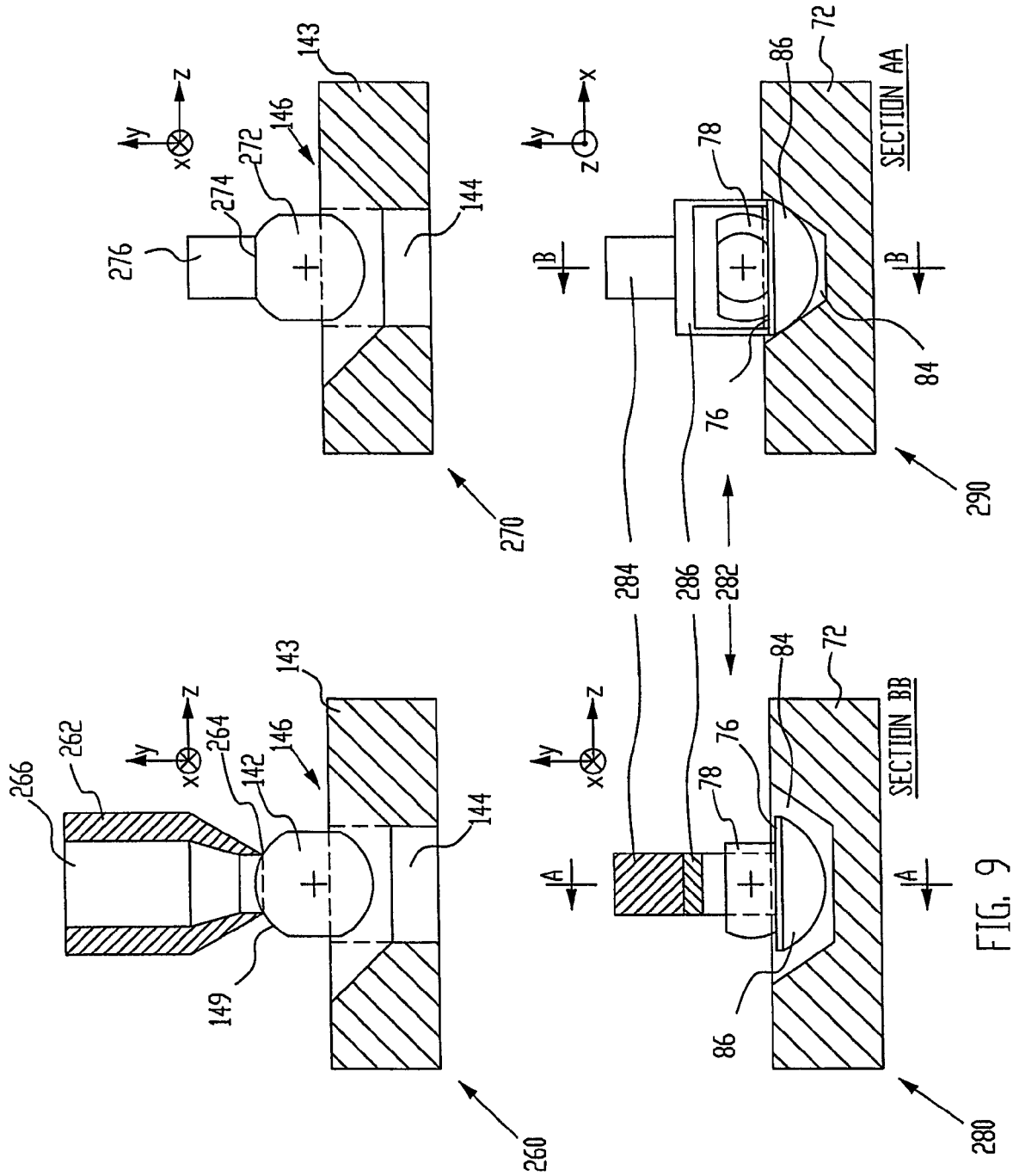

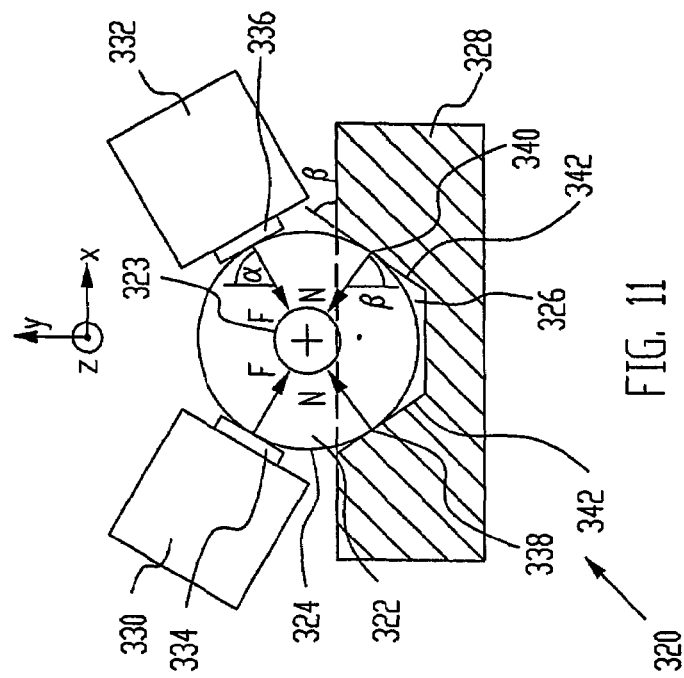
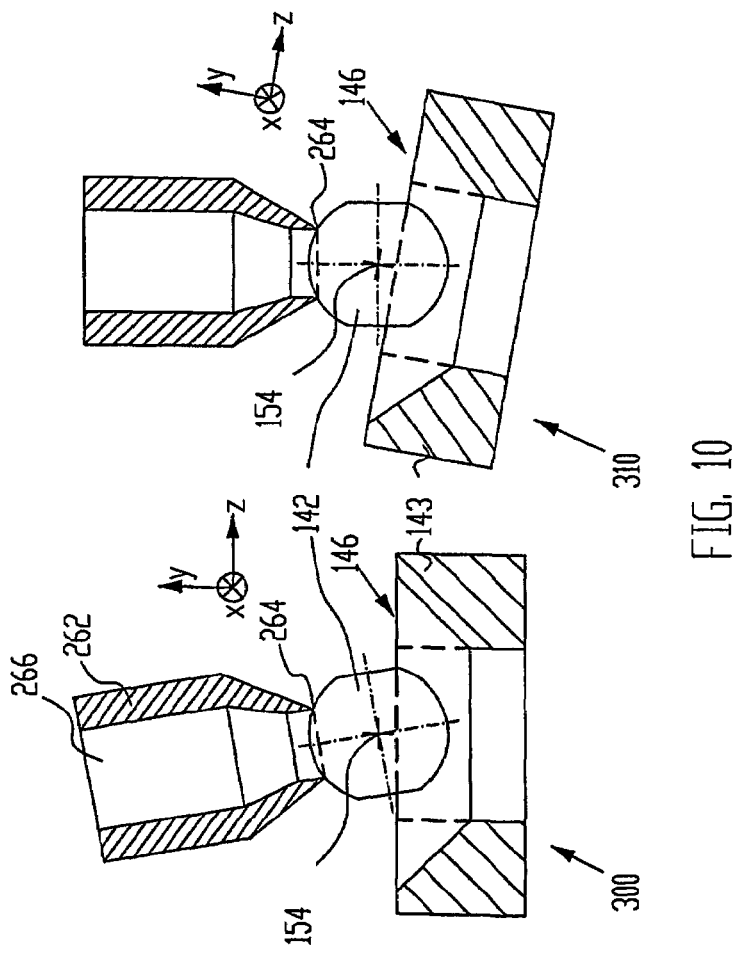
FIG. 11
FIG. 10

MICRO-OPTIC ALIGNMENT SYSTEM

CROSS-REFERENCE TO RELATED APPLICATION

This application claims the benefit of U.S. Provisional application 60/483,536, filed 30 Jun. 2003, which is incorporated herein by reference.

FIELD OF THE INVENTION

The present invention relates generally to optical devices, and specifically to alignment of the devices.

BACKGROUND OF THE INVENTION

Individual components of an optical system typically need to be aligned in order for the system to function efficiently. In the case of small components using coherent radiation, such as laser diodes and other semi-conducting optical elements, the alignments need to be of the order of 0.5 µm or better. Passive alignment, wherein components are positioned and are used without further adjustment, is typically unable to achieve this level of alignment. Consequently, active alignment, wherein positions of components are adjusted after initial positioning, with the radiation on, is normally required to complete the alignment process. A number of active alignment systems are known in the art.

U.S. Pat. No. 4,753,510, to Sezerman, whose disclosure is incorporated herein by reference, describes an adjustable connector for coupling a pair of fibre optics. Each optic is removably coupled to a beam expanding lens in a base plate, and the plates are adjusted relative to each other. A level of the signal transmitted between the fibre optics is used to determine when the fibre optics are correctly aligned.

U.S. Pat. No. 4,989,940, to Wollenweber et al., whose disclosure is incorporated herein by reference, describes a system for aligning a fibre optic to a ball lens of a connector. Light from the ball lens is focussed onto a quadrant electrometer, and the fibre optic is adjusted in x, y, and z directions until the output from the quadrants is a minimum.

U.S. Pat. No. 5,253,834, to Sullivan et al., whose disclosure is incorporated herein by reference, describes an alignment fixture having a spherical sector. The spherical surface of the sector rests on a plate, the plate being moved to align a flat surface of the sector. An object for alignment is mounted on the flat surface, and the fixture enables the object to be adjusted in an unobstructed manner.

U.S. Pat. No. 5,937,123, to Frelier, whose disclosure is incorporated herein by reference, describes a fibre optic alignment device. The fibre optic is fed through and bonded to a stainless steel ball. The ball is held in place in the device by springs, which allow the ball to be rotated so that the fibre optic aligns with a lens in the device. After alignment the ball is fixed in place.

U.S. Pat. No. 6,170,795, to Wayne, whose disclosure is incorporated herein by reference, describes a system for aligning a sphere. The sphere contains an optical device, or may at least partially be the optical device. To align the device, the sphere is mounted on balls so that it may be rotated about its center. The multiple ball mounting enables rotation of the sphere about its center, while precluding linear motion of the center.

U.S. Pat. No. 6,430,337, to Bergmann et al., whose disclosure is incorporated herein by reference, describes a system for aligning a light beam generated by a wavelength division multiplexer surface. The system includes an optical wedge which is adjusted until the light beam aligns with a light path through the system.

U.S. Pat. Nos. 6,536,736 and 6,570,721, to Wayne et al., whose disclosures are incorporated herein by reference, describe a sphere which acts as an optomechanical mounting. The sphere is held in place by springs which allow the sphere to rotate about its center, while preventing lateral movement of the center. The sphere may have openings in the sphere for light paths or for tools to adjust the sphere's alignment.

U.S. Pat. No. 6,709,169, to Rossi, whose disclosure is incorporated herein by reference, describes a structure that couples a laser diode to a fibre optic. The structure includes a ball through which the fibre optic penetrates. A tube holds the ball, the laser diode, and a lens coupling the light from the laser diode into the fibre optic. The ball may be rotated and moved within the tube to align the diode and the fibre optic.

U.S. Patent Application 2002/0179792, to Wu et al., whose disclosure is incorporated herein by reference, describes a clamp for a ball with a hole traversing the ball. An optical component is inserted in the hole. The ball is held in the clamp, and may be rotated, without translation, in the clamp, so as to align the component.

U.S. Patent Application 2003/0063870, to Reis, whose disclosure is incorporated herein by reference, describes a micro-assembly which holds a micro-element. The micro-assembly has a rounded portion which contacts a support structure upon which the micro-assembly is mounted. The rounded portion may be translated and rotated relative to the support structure, thereby allowing alignment of the micro-element.

In a publication entitled "A Compact Transmitter and Receiver for 10-Gbit/s Transceiver Modules," by Kanda et al. published in the proceedings the 15*th Annual Meeting of the IEEE Lasers and Electro-Optics Society,* 2002, (*LEOS* 2002) page 606, which is incorporated herein by reference, the authors describe an optical module transmitting collimated light into a fibre optic. A laser diode and a lens are passively aligned in guiding grooves, and the fibre is actively aligned with radiation from the lens.

Notwithstanding the alignment systems presently in use, there is a need for a simple and versatile optical alignment system.

SUMMARY OF THE INVENTION

In an embodiment of the present invention, an optical element comprises a curved surface, typically a spherically curved surface, which acts to refract, diffract, and/or reflect incident radiation. The element is positioned in an opening in an optical bench upon which are mounted one or more optical components. The opening comprises one or more regions which contact the curved surface of the optical element, the contact between the curved surface and the regions supporting the optical element. The one or more contact regions allow the optical element to be rotated and/or translated so as to align the optical element with the one or more optical components.

After the rotations and/or translations have been made, the one or more contact regions maintain the element in alignment. Once aligned, the element may be fixed in position in relation to the opening, the one or more contact regions ensuring that there is substantially no movement during the fixation process. Locating the optical element in an opening of an optical bench which enables the element to be adjusted in position, and which also enables the element to be fixed in the position with no need for further adjustment after fixation, provides a simple, versatile, and efficient alignment system.

In some embodiments of the present invention, the opening has the shape of an inverted truncated pyramid, which typically has four sides and a square base and top. Alternatively, the base and the top have the shape of elongated rectangles, rather than squares. In a further alternative embodiment of the present invention, the opening comprises a slit in the optical bench.

The optical element may comprise one or more other surfaces which reflect, refract and/or diffract radiation, in addition to the curved surface. Such surfaces typically comprise planar or non-planar surfaces, which may be implemented to act as at least partial reflection and/or transmission surfaces. Sizes of the optical element and of the opening may be set so that no translation of the element is possible; alternatively, the sizes may be set so that translation of the element is possible within the opening in one or two dimensions.

In an embodiment of the present invention, at least a portion of the interior of the optical element may be implemented to reflect, refract and/or diffract radiation, so that a path of radiation penetrating surfaces of the element may be altered within the element.

In an alternative embodiment of the present invention, the curved surface is formed in a holder for the optical element, the latter being mounted on the holder. The curved surface of the holder contacts the one or more regions of the opening, while allowing the optical element to be aligned by rotation and/or translation of the curved surface of the holder.

In a yet further embodiment of the present invention, the curved surface contacts a mounting surface of the optical bench upon which are also mounted the components, rather than the element and/or the holder being positioned in and contacting the opening.

In a further alternative embodiment of the present invention, an internal optical element is located within the optical element, and the curved surface comprises an opening for the internal optical element.

There is therefore provided, according to an embodiment of the present invention, optical alignment apparatus, including:

an optical element having a curved surface; and an optical bench, including a mounting surface for mounting of an optical component thereon and having an opening formed in the mounting surface, the opening having a size and shape suitable to engage the curved surface of the optical element so as to permit alignment of the optical element with the optical component by relative rotation of the optical element within the opening while the curved surface is engaged by the opening.

The curved surface typically has a center of curvature, and the size and shape of the opening are such as to permit the alignment by rotation of the optical element about the center of curvature.

In an embodiment, the opening has a position in the mounting surface relative to the optical component so as to permit the alignment of the optical element with the component. Typically, the size and shape of the opening permit the alignment of the optical element with the component by translation of the optical element within the opening while the curved surface is engaged by the opening.

In an embodiment, the curved surface performs at least one of refraction, reflection, and diffraction of electromagnetic (EM) radiation incident thereon, and the alignment includes adjusting a path of the radiation between the component and the optical element.

In an alternative embodiment, the optical element includes a region within the optical element that is adapted to perform at least one of refraction, reflection and diffraction of EM radiation incident on the region, and the alignment includes adjusting a path of the EM radiation between the region and the component.

Typically, the mounting surface includes a surface having predetermined dimensions, including a planar surface, and/or at least one of a stepped planar surface, a plane ramp, and a curved surface.

Typically, the curved surface is engaged by the opening at one or more support regions, and the apparatus further includes fixing the optical element to the opening while the curved surface is engaged by the opening at the one or more support regions.

In an embodiment, the relative rotation includes at least one of rotating the optical element and maintaining the optical bench stationary, rotating the optical bench and maintaining the optical element stationary, and rotating the optical element and the optical bench.

In an embodiment, the curved surface includes at least one further surface configured thereon, and the alignment includes adjusting a path of EM radiation transferred between the at least one further surface and the component. The at least one further surface may include a plane surface, wherein the path includes the plane surface and a region of the curved surface. Alternatively or additionally, the at least one further surface includes a first plane surface and a second plane surface parallel to the first plane surface, wherein the path includes the first and the second plane surface. The at least one further surface may include a reflecting surface. Alternatively or additionally, the curved surface has a first curvature, wherein the at least one further surface includes a further curved surface having a second curvature different from the first curvature, and wherein the path includes the further curved surface and a region of the curved surface.

In a disclosed embodiment, the apparatus includes one or more actuators which are configured to contact the curved surface, and which are adapted to perform the relative rotation as one of two or more rotations orthogonal to each other. Typically, the one or more actuators include two actuators distributed symmetrically with respect to the optical element.

In an embodiment, the apparatus includes an internal optical element configured within the optical element, and an optical element opening to the internal optical element is configured within the curved surface. Typically, the optical element opening is configured to enable at least one of access to the internal optical element and passage of EM radiation between the optical component and the internal optical element. The internal optical element may include at least one of a reflective element, a refractive element, and a diffractive element.

There is further provided, according to an embodiment of the present invention, a method for optical alignment, including:

providing an optical element having a curved surface; and mounting an optical component on a mounting surface of an optical bench; and forming an opening in the mounting surface, the opening having a size and shape suitable to engage the curved surface of the optical element so as to permit alignment of the optical element with the optical component by rotation of the optical element within the opening while the curved surface is engaged by the opening.

Typically, the curved surface has a center of curvature, and the size and shape of the opening are such as to permit the alignment by rotation of the optical element about the center of curvature. The size and shape of the opening typically permit the alignment of the optical element with the component by translation of the optical element within the opening while the curved surface is engaged by the opening.

In an embodiment, the curved surface performs at least one of refraction, reflection, and diffraction of electromagnetic (EM) radiation incident thereon, and the alignment includes adjusting a path of the radiation between the component and the optical element. Typically, the curved surface includes at least one further surface configured thereon, and the alignment includes adjusting a path of EM radiation transferred between the at least one further surface and the component.

In a disclosed embodiment, the optical element includes a region within the optical element that is adapted to perform at least one of refraction, reflection and diffraction of EM radiation incident on the region, and the alignment includes adjusting a path of the EM radiation between the region and the component.

The method may further include configuring an internal optical element within the optical element, and configuring an optical element opening to the internal optical element within the curved surface.

Typically, the curved surface is engaged by the opening at one or more support regions, and the method includes fixing the optical element to the opening while the curved surface is engaged by the opening at the one or more support regions.

The method may further include contacting the curved surface with one or more actuators which are adapted to perform the relative rotation as one of two or more rotations orthogonal to each other. Typically, the one or more actuators include two actuators distributed symmetrically with respect to the optical, element.

There is further provided, according to an embodiment of the present invention, Optical alignment apparatus, including:

a holder having a curved surface;

an optical element which is mounted on the holder; and an optical bench, including a mounting surface for mounting of an optical component thereon and having an opening formed in the mounting surface, the opening having a size and shape suitable to engage the curved surface of the holder so as to permit alignment of the optical element with the optical component by relative rotation of the holder within the opening while the curved surface is engaged by the opening.

There is also provided, according to an embodiment of the present invention, optical alignment apparatus, including:

an optical element having a curved surface; and an optical bench, having a mounting surface for mounting of an optical component thereon and for engaging the curved surface of the optical element so as to permit alignment of the optical element with the optical component by relative rotation of the optical element on the mounting surface while the curved surface is engaged thereon.

There is yet further provided, according to an embodiment of the present invention, optical alignment apparatus, including:

a holder having a curved surface;

an optical element which is mounted on the holder; and an optical bench, including a mounting surface for mounting of an optical component thereon and for engaging the curved surface so as to permit alignment of the optical element with the optical component by relative rotation of the holder on the mounting surface while the curved surface is engaged thereon.

There is further provided, according to an embodiment of the present invention, a method for optical alignment, including:

providing a holder having a curved surface;

mounting an optical element on the holder;

mounting an optical component on a mounting surface of an optical bench; and forming an opening in the mounting surface, the opening having a size and shape suitable to engage the curved surface of the holder so as to permit alignment of the optical element with the optical component by relative rotation of the optical element within the opening while the curved surface is engaged by the opening.

There is also provided, according to an embodiment of the present invention, a method for optical alignment, including:

providing an optical element having a curved surface;

mounting an optical component on a mounting surface of an optical bench; and engaging the curved surface of the optical element with the mounting surface so as to permit alignment of the optical element with the optical component by relative rotation of the optical element on the mounting surface while the curved surface is engaged therewith.

There is further provided, according to an embodiment of the present invention, a method for optical alignment, including:

providing a holder having a curved surface;

mounting an optical element on the holder;

mounting an optical component on a mounting surface of an optical bench; and engaging the curved surface of the holder with the mounting surface so as to permit alignment of the optical element with the optical component by relative rotation of the holder on the mounting surface while the curved surface is engaged therewith.

There is yet further provided, according to an embodiment of the present invention, optical alignment apparatus, including:

an optical element having a curved surface; and an optical bench, including a mounting surface having an opening formed in the mounting surface, the opening having a size and shape suitable to engage the curved surface of the optical element so as to permit alignment of the optical element with an optical component fixed in relation to the optical bench by relative rotation of the optical element within the opening while the curved surface is engaged by the opening.

Typically, the curved surface has a center of curvature, and the size and shape of the opening are such as to permit the alignment by rotation of the optical element about the center of curvature.

The apparatus typically includes one or more actuators coupled to the optical bench, the one or more actuators being adapted to perform the relative rotation. The one or more actuators may be embedded in the optical bench. Alternatively or additionally, the one or more actuators may be attached to the optical bench. Typically, the one or more actuators contact the curved surface. Alternatively or additionally, the one or more actuators produce surface waves which contact the curved surface.

There is further provided, according to an embodiment of the present invention, a method for optical alignment, including:

providing an optical element having a curved surface; and forming an opening in a mounting surface of an optical bench, the opening having a size and shape suitable to engage the curved surface of the optical element so as to permit alignment of the optical element with an optical component fixed in relation to the optical bench by rotation of the optical element within the opening while the curved surface is engaged by the opening.

Typically, the curved surface has a center of curvature, and the size and shape of the opening are such as to permit the alignment by rotation of the optical element about the center of curvature.

The method typically includes coupling one or more actuators to the optical bench, the one or more actuators being adapted to perform the relative rotation.

In an embodiment, coupling the one or more actuators includes embedding the one or more actuators in the optical bench. Alternatively or additionally, coupling the one or more actuators includes attaching the one or more actuators to the optical bench. In an embodiment, the one or more actuators may contact the curved surface. Alternatively or additionally, the one or more actuators produce surface waves which contact the curved surface.

The present invention will be more fully understood from the following detailed description of the embodiments thereof, taken together with the drawings, a brief description of which is given below.

BRIEF DESCRIPTION OF THE DRAWINGS

FIG. 3 is a schematic sectional view of an optical element, according to an embodiment of the present invention;

FIG. 4 is a schematic sectional view of an alternative optical element, according to an embodiment of the present invention;

FIG. 8 shows schematic sectional side and top views of an alternative optical element, according to an embodiment of the present invention;

FIG. 9 shows schematic sectional views of apparatus for gripping an optical element, according to an embodiment of the present invention;

FIG. 10 shows schematic sectional views illustrating methods for adjusting an optical element, according to an embodiment of the present invention;

FIG. 11 is a schematic sectional view illustrating a method for adjusting an optical element, according to an embodiment of the present invention;

DETAILED DESCRIPTION OF EMBODIMENTS

Figure 1:
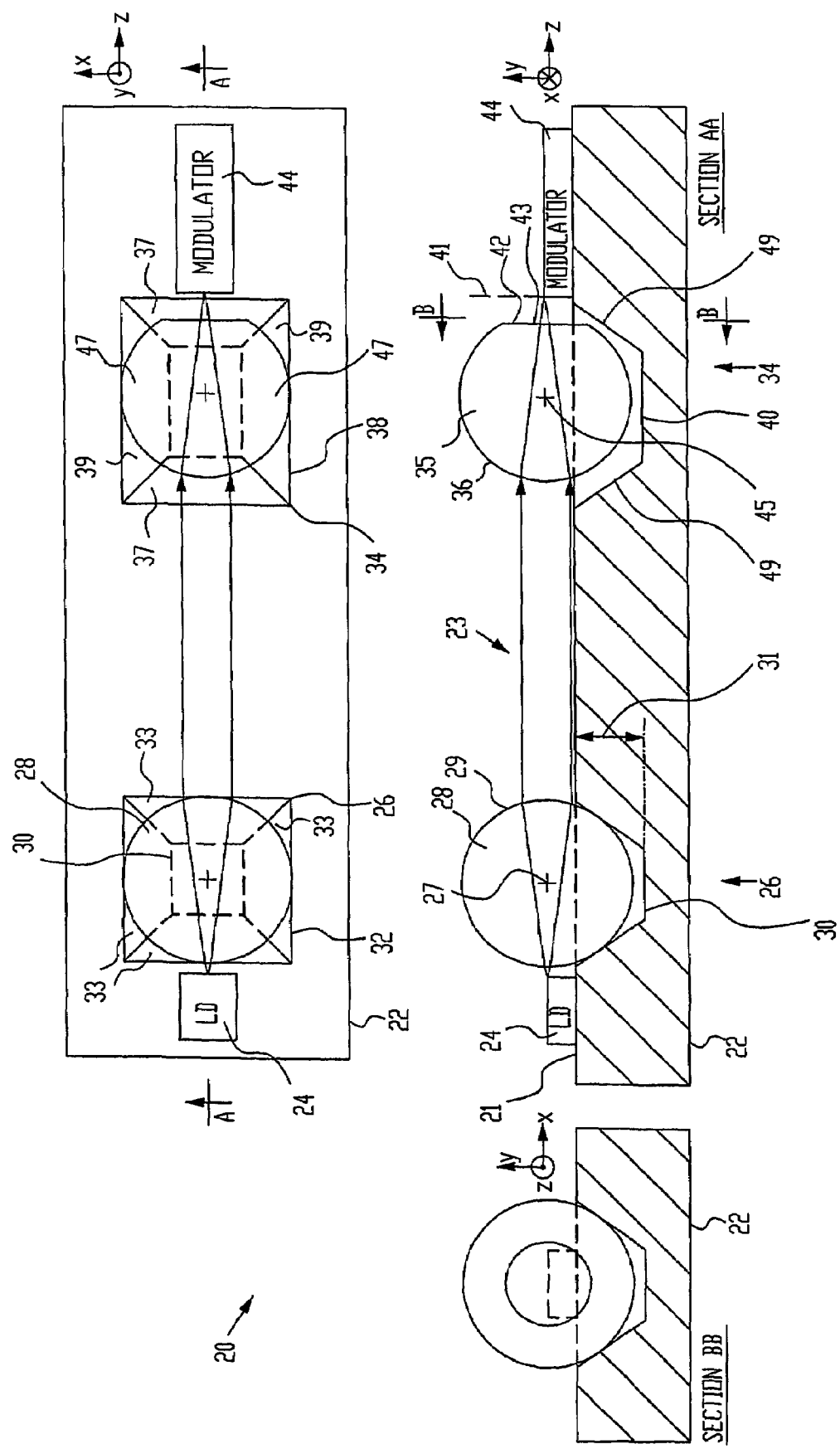
FIG. 1 is a schematic diagram showing three views of an alignment system, according to an embodiment of the present invention.

Reference is now made to FIG. 1, which is a schematic diagram showing three views of an alignment system 20, according to an embodiment of the present invention. System 20, by way of example, aligns a laser diode 24 with an electro absorption modulator 44. The description below is directed towards alignment of optical elements which typically operate at visible or near-visible wavelengths such as infra-red (IR) and ultra-violet (UV) wavelengths. However, it will be understood that alignment system 20, and other alignment systems described hereinbelow, may be used to align electromagnetic (EM) radiation, and elements which operate with this radiation, for EM radiation having other wavelengths differing from visible or near-visible wavelengths, such as microwave wavelengths.

The terms "optical element" and "optical component," as used in the present patent application and in the claims, should thus be understood to refer respectively to any element and component operating in a visible, IR, UV, microwave, or other radiation range.

In the description herein, surfaces of elements may interact with radiation by reflecting, refracting, diffracting, and/or transmitting radiation incident at the surface. It will be appreciated that such surfaces may be coated, by methods well known in the art, with coatings that provide specific properties to the reflected/refracted/diffracted/transmitted radiation. All such coated surfaces are assumed to be comprised within the scope of the present invention, and in the specification and in the claims, surfaces which interact with radiation are to be assumed to comprise coated surfaces.

Laser diode 24 and modulator 44 are mounted on a mounting surface 21 of an optical bench 22. Surface 21 is typically planar, although it will be appreciated that the mounting surface may comprise planar steps, or have another well-defined form having predetermined dimensions, such as a plane ramp, or a curved surface with a defined curvature, the surface being suitable for mounting components. By way of example, unless otherwise stated hereinbelow, surface 21 is assumed to be planar. A line from the diode, towards the modulator and generally parallel to the surface 21, is assumed to define an optical axis of the system. Unless otherwise stated hereinbelow, a line in the surface of the optical bench, and generally parallel to the optical axis, is assumed to define a z-axis. A line into the plane of the paper and at right angles to the z-axis is assumed to define an x-axis, and a line orthogonal to surface 21 and out of the optical bench is assumed to define a y-axis. Inset into surface 21 is a first opening 26 and a second opening 34. Opening 26 is in the shape of a generally symmetrical four-sided truncated pyramid, having a square base 30 and a square top 32, larger than the base and aligned generally symmetrically with the base, the base and the top being generally parallel to an x-z plane. Opening 26 thus comprises four substantially similar trapezoidal sides 33. Openings such as openings 26 and 34 may also be referred to as V-grooves, opening 26 being a special symmetric case.

It will be appreciated that optical bench 22 may typically be formed from a crystalline material having a substantially plane surface whereon optical, electro-optical, and other components such as electronic devices may be mounted. Openings and indentations in the bench, such as openings 26 and 34, may be formed by a number of processes well known in the art, such as photolithography and micro-machining of a crystalline material such as silicon, so that it will be appreciated that the scope of the present invention applies to substantially any form of opening or indentation in an optical bench. It will further be appreciated that the scope of the present invention applies to other forms of optical bench having a substantially plane or stepped plane surface, or other well-defined surface, whereon optical components may be mounted. Such benches include those known in the art as optical tables or tabletops, and are typically formed from a plurality of different components and materials, such as metal and ceramics.

A substantially spherical lens 28, also herein termed a ball lens, is placed in opening 26, which is dimensioned so that a surface 29 of the ball contacts sides 33, and so that a center 27 of the ball is approximately on the optical axis. Opening 26 is positioned relative to laser diode 24 so that refraction at surface 29 of ball lens 28 focuses diverging radiation from the diode into a generally collimated beam 23. Typically, ball lens 28 has a diameter of the order of 1 mm, and top 32 of the opening has a side length approximately equal to the diameter of the ball lens. Typically, if bench 22 is formed from crystalline material, angles of sides 33 are defined by a crystalline plane, which are 54° 42' for a [100] direction in silicon. The ball lens is typically implemented to rest on sides 33, and a depth 31 of opening 26, i.e., the distance between top 32 and base 30, is set so as to allow clearance for the bottom of the ball lens. Thus, opening 26 has a size and a shape which enables the opening to engage curved surface 29 on the sloping sides 33.

The generally collimated beam from ball lens 28 is directed to a spherical surface 36 of a partially spherical optical element 35. In addition to its spherical surface 36, element 35 also comprises a plane surface 42, so that the element acts as a thick plano-convex lens which is able to focus the incoming generally collimated radiation onto modulator 44. Typically, spherical surface 36 has a diameter of the order of 1 mm, and a diameter 43 of surface 42 is of the order of 0.5 mm.

Element 35 is positioned in opening 34, which, except as described hereinbelow, is generally similar to opening 26. Unlike opening 26, opening 34 is elongated along the z-axis, having a base 40 and a top 38 which are substantially elongated rectangles, a longer side of their respective rectangles being parallel to the z-axis. Opening 34 thus comprises a first pair of substantially similar trapezoidal sides 37, and a second pair of substantially similar trapezoidal sides 39, longer than sides 37. Typically, top 38 has approximate dimensions of 1.5 mm×1 mm, and base 40 has a dimension determined by the top dimensions and angles of the bench's crystalline planes. Thus, as for opening 26, opening 34 has a size and a shape which enables the opening to engage the curved surface of element 35 on sides 39, when the element is inserted in the opening.

Alignment of diode 24 with modulator 44 is achieved by active alignment of element 35, using combinations of translation and rotation of the element. Element 35 may be translated along the z-axis, and may be rotated about any axis through a center 45 of spherical surface 36. The translations and rotations are implemented while maintaining spherical surface 36 in sliding and/or rolling contact with both sides 39, at regions 47, as well as possibly in sliding contact at one of regions 49 in sides 37. It will be appreciated that translation along the z-axis enables collimated beam 23 to be focussed onto an x-y plane 41 including modulator 44. Furthermore, rotation about an axis through center 45 and parallel to the x-axis moves the focussed beam generally in a y-direction in plane 41, and rotation about an axis through center 45 and parallel to the y-axis moves the focussed beam generally in an x-direction in plane 41. Suitable methods for translating and rotating element 35 and other elements referred to herein are described in more detail below, with reference to FIGS. 9-13.

It will be appreciated that the active alignment of element 35 is achieved while spherical surface 36 of the element is in continuous contact at regions 47, and possibly at one of regions 49, with the sides of opening 34, which are in turn formed in optical bench 22. Since laser diode 24 and modulator 44 are fixed to the optical bench, once element 35 has been correctly positioned, fixing of the element to optical bench, at regions 47—and also if appropriate at one of regions 49—will cause substantially no relative movement between element 35, diode 24 and modulator 44. Thus, any requirement for alignment after fixing is effectively eliminated.

As described above, ball lens 28 is passively aligned in the system, by being positioned in opening 26. In an alternative embodiment of system 20, opening 26 is configured as an elongated opening, with substantially similar dimensions as those of opening 34. The elongation may be parallel to the z-axis, in which case ball 28 may be translated parallel to the axis so as to more accurately collimate radiation from diode 24. Alternatively the elongation is parallel to the x-axis, in which case ball 28 may be translated along the x-axis, causing the focussed beam at modulator 44 to also translate generally parallel to the x-axis.

In a further alternative embodiment of system 20, opening 26 and/or opening 34 are generally as described above, but are dimensioned so that the respective elements in the openings—ball lens 28 and element 35—are able to be translated in two dimensions in the x-z plane. In this case ball lens 28 is supported at least by a contact region in base 30, and element 35 is supported at least by a contact region in base 40. It will be appreciated that such two-dimensional translation does not preclude the possibility of rotation of ball lens 28 about its center 27 or of element 35 about center 45.

Figure 2:
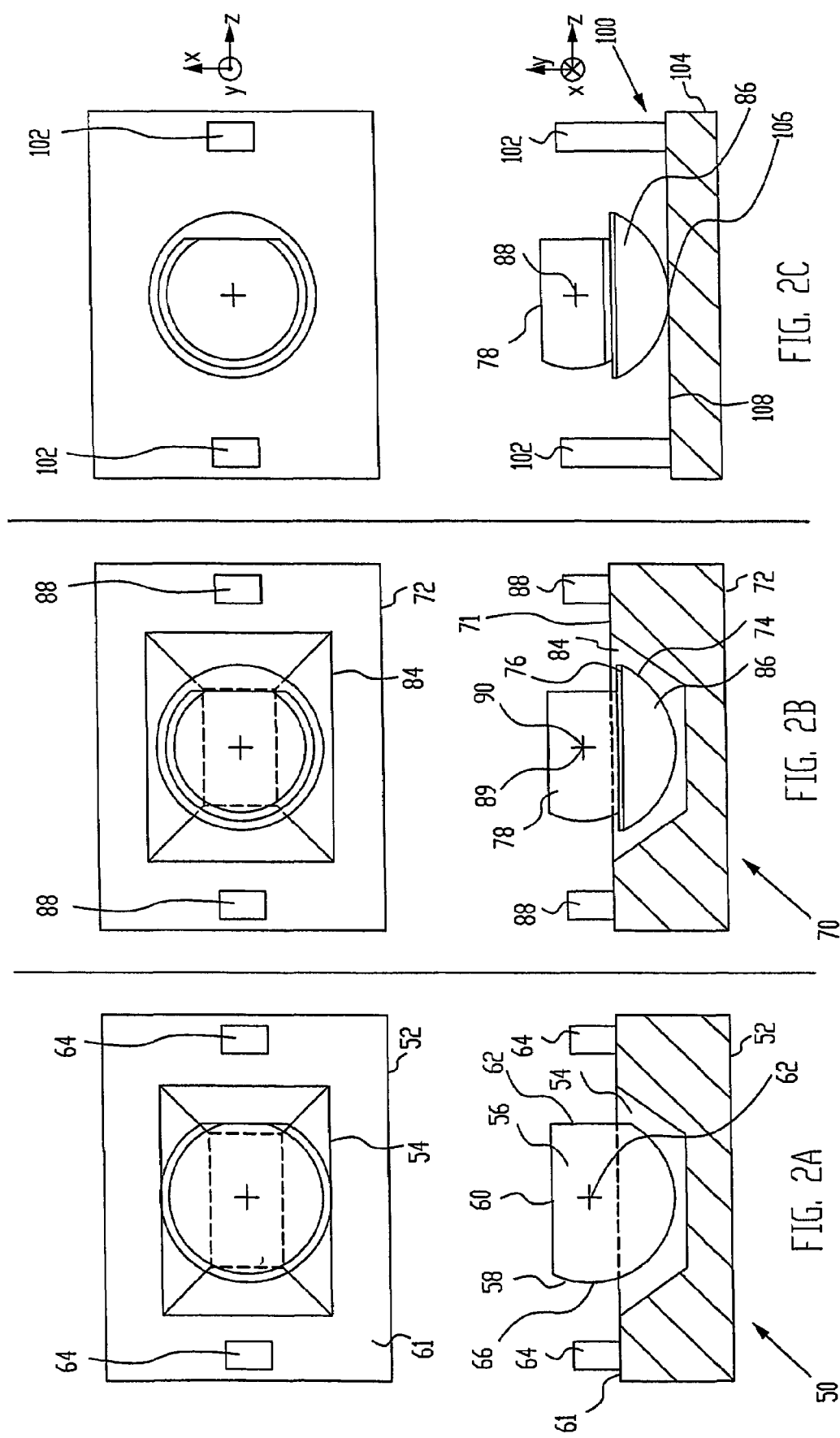
FIGS. 2A, 2B and 2C are schematic top and sectional views of optic alignment systems that may be used for active alignment, according to embodiments of the present invention.

FIGS. 2A, 2B and 2C are schematic top and sectional views of optic alignment systems that may be used for active alignment, according to embodiments of the present invention. An optical alignment system 50 (FIG. 2A) comprises an optical bench 52 within which is formed an opening 54. System 50 is used to actively align radiation to or from one or more components 64, which are typically mounted on bench 52, or which are alternatively mounted separately from the bench and are coupled fixedly to the bench. Opening 54 is generally similar to opening 34 (FIG. 1), being formed in the shape of an elongated truncated inverted four-sided pyramid, the elongation being along a z-axis of system 50. It will be appreciated that for openings implemented in crystalline material, the amount of truncation is typically a function of an etching time, and that inverted pyramids with substantially no truncation may be produced using a relatively long etching time. Thus, openings in the form of both truncated and non-truncated inverted pyramids are assumed to be comprised within the scope of the present invention.

An optical element 56, generally similar to element 35 (FIG. 1), is placed within opening 54. Element 56 comprises a spherically curved surface 58, having a center of curvature 62. Surface 58 acts as a first refractive surface in a region 66 of the surface. Surface 58 also acts as a supporting surface contacting sides of opening 54. Element 56 also comprises a plane surface 62, which acts as a second refractive surface. As described below, surface 58 and surface 62 are translated and/or rotated, by adjusting element 56 so as to align the one or more components 64 with element 56.

Unlike element 35, element 56 is truncated at its top, forming a surface 60 of the element. Typically, the radiation path between surfaces 58 and 62 does not include surface 60.

Element 56 is adjusted substantially as described above for element 35, by being translated along the z-axis, and/or rotated about center 62, so that the one or more components 64 are aligned. In some embodiments of the present invention, surface 60 may be used as a fiduciary surface. For example, if surface 60 has been formed to be plane and orthogonal to surface 62, the latter may be set to be orthogonal to an upper surface 61 of bench 52 by ensuring in the alignment process that plane 60 is nominally parallel to surface 61.

An optical alignment system 70 (FIG. 2B) comprises an optical bench 72 within which is formed an opening 84. System 70 is used to actively align radiation between an optical element 78 and one or more components 88 which are typically mounted on bench 72, or which are alternatively mounted separately from the bench and are coupled fixedly to the bench. Opening 84 is generally similar to opening 34 (FIG. 1), being formed in the shape of an elongated truncated inverted four-sided pyramid, the elongation being along a z-axis of system 70. A section 86 comprises a first, spherically curved, surface 74 and a second surface 76, typically plane, to which is mounted optical element 78. Section 86 thus acts as a holder for element 78, and is also herein termed a sectional holder. Surface 74 has a center of curvature 90. By way of example, element 78 is assumed to be a section of a plano-convex lens, although it will be understood that element 78 may be substantially any other optical element that is to be aligned with components 88. In some embodiments of the present invention, element 78 comprises an optical center 89 which is placed substantially in registration with center 90.

Sectional holder 86 is dimensioned so that it may be positioned within opening 84, and so that its spherically curved surface may contact one or more surfaces of the opening. Element 78 is aligned with components 88 by translating and/or rotating sectional holder 86, maintaining spherically curved surface 74 in contact with at least one surface of opening 84 during the course of the alignment process, and using the region or regions formed by the contact as support regions when alignment has been achieved. It will be understood that, depending on the relative dimensions of sectional holder 86 and opening 84, the contact regions allow element 78 to be rotated with three rotational degrees of freedom about its center 88, as well as allowing the element to be translated in one or two dimensions of a plane parallel to a surface 71 of bench 72. In some embodiments of the present invention, opening 84 is configured to only permit rotation and to prohibit translation of the element. For example, opening 84 may be configured as an inverted square pyramid, with all four sides contacting holder 86.

An optical alignment system 100 (FIG. 2C) is an alternative alignment system to system 70 for element 78 and section 86. It will be understood that system 100 may also be applied, mutatis mutandis, to other optical elements and/or supports. System 100 is used to actively align radiation to or from one or more components 102 which are typically mounted on a bench 104, or which are alternatively mounted separately from the bench and are coupled fixedly to the bench. Rather than element 78 and section 86 being positioned in an opening of bench 104, the element and section are positioned on an upper surface 108 of the bench, forming a contact region 106 with the bench. As described above, element 78 may be translated in two dimensions parallel to surface 108, and may be rotated with three degrees of freedom about center 88. The translations and/or rotations use region 106 as a support region during the alignment process, and also when alignment has been achieved and element 78 has been fixed in place. Using the same support region for both purposes substantially obviates the need for post-alignment adjustment.

Hereinbelow, the descriptions for alignment comprise rotation and/or translation of an optical element, using one or more regions of a surface of an optical bench, or of an opening therein, as support regions. As for the systems described above, fixation of the optical element may be achieved using the one or more support regions, which maintain continuous contact between the optical element and the optical bench surface. Also as described above, using the one or more support regions as fixation regions substantially obviates the need for post-alignment adjustment.

FIG. 3 is a schematic sectional view 110 of an optical element 111, according to an embodiment of the present invention. As described in more detail below, rotation of element 111 may be used to translate radiation incident on the element by a pre-determined amount, and in a pre-determined direction. Element 111 comprises a first spherical surface 116 having a radius r, typically of the order of 0.5 mm, and a center of curvature 122. Surface 116 is used, as described below, as a refracting surface and also as a support surface for the element. Element 111 also comprises a second surface 118. In view 110, surface 118 meets surface 116 in points A and B, and AB is typically approximately equal to, or less than, r, although AB may be any other convenient length. Element 111 is typically positioned in an opening 114 in an optical bench 112. Opening 114 has a generally similar shape as openings 26 or 34 (FIG. 1) and, if r is of the order of 0.5 mm, is dimensioned generally according to opening dimensions described above. Alternatively, element 111 may be positioned on an upper surface 113 of optical bench 112, substantially as described above with reference to FIG. 2C. Contact regions between surface 113, or surfaces of opening 114, and surface 116 operate as support regions during and after alignment.

In an embodiment of element 1.11, surface 118 is spherical, having a radius R and a center of curvature 124. Typically R>r. Element 111 has an optic axis 126 on a line joining points 122 and 124, and in a paraxial approximation an incident beam 132 parallel to a system optical axis 129, incident from the left onto surface 118, is focussed to a point 128 in a focal plane 130. Rotation of element 111 by an angle δ about an axis through point 122, orthogonal to section 110, deflects beam 132 as described hereinbelow.

If beam 132 has an incident slope (measured relative to the system optical axis 129) $r_i'$, and at surface 118 is displaced from the axis by $r_i$, a slope $r_o'$ and a displacement $r_o$ in plane 130, for the output beam, are given by equation (1):

$$\begin{pmatrix} r_o \\ r_o' \end{pmatrix} = \frac{2-n}{n} \begin{pmatrix} 0 & \frac{2r}{2-n} + f_b \\ -\frac{1}{f_b} & 1 \end{pmatrix} \begin{pmatrix} r_i \\ r_i' \end{pmatrix} - \delta(n-1) \frac{2-n}{n} \frac{R-r}{R} \begin{pmatrix} \frac{2r}{2-n} + f_b \\ 1 \end{pmatrix} \tag{1}$$

where n is a refractive index of element 111, and $f_b$ is a back focal plane length for element 111.

The back focal plane length $f_b$ is given by equation (2):

$$f_b = \frac{1 - 2\frac{n-1}{n}\frac{r}{R}}{\frac{n-1}{r}\left(1 - \frac{n-2}{n}\frac{r}{R}\right)} \tag{2}$$

In alternative embodiments of element 111, surface 118 is plane, aspheric, and/or diffractive. If surface 118 is plane (so that element 111 is substantially similar to element 36 (FIG. 1)), equations (1) and (2) simplify to equations (3) and (4) respectively:

$$\begin{pmatrix} r_o \\ r'_o \end{pmatrix} = \frac{2-n}{n} \begin{pmatrix} 0 & \frac{2r}{2-n} + f_b \\ -\frac{1}{f_b} & 1 \end{pmatrix} \begin{pmatrix} r_1 \\ r'_1 \end{pmatrix} - \delta(n-1)\frac{2-n}{n}\begin{pmatrix} \frac{2r}{2-n} + f_b \\ 1 \end{pmatrix} \quad (3)$$

and $$f_b = \frac{r}{n-1} \quad (4)$$

If surface 118 is aspheric and/or diffractive, those skilled in the art will be able to formulate expressions for $r_o$, $r_o'$, and $f_b$ according to the type of surface.

Inspection of FIG. 3 shows that rotation of element 111 about an axis parallel to the x-axis translates the focussed output parallel the y-axis. Similarly, rotation of element 111 about an axis parallel to the y-axis translates the focussed output parallel to the x-axis.

It will be understood that element 111 may also comprise one or more other surfaces, typically in a region 117 generally opposite surface 118, and typically of a form generally similar to one of the forms described above for surface 118.

FIG. 4 is a schematic sectional view 140 of an optical element 142, according to an embodiment of the present invention. Element 142 comprises a substantially spherical lens 148, having a spherical surface 149 on which are formed parallel plane surfaces 150 and 152. In an embodiment of the present invention an opening 146 which is in the shape of a slit 145, along the z-direction, is formed in an optical bench 143. Slit 145 forms edges 141 with a surface 151 of the bench. In some embodiments of the present invention, slit 145 comprises a chamfer 147, having an angle which is typically independent of any crystal plane comprised in bench 143. In some embodiments of the present invention, slit 145 penetrates bench 143 as a through opening 144.

Element 142 is positioned so that surface 149 contacts edges 141; alternatively, if chamfer 147 is present, the element is positioned so that surface 149 contacts the chamfer.

Rotation of element 142 about a center 154 of the element, parallel to the x-axis or the y-axis, causes a beam 156 of radiation incident on surface 150 to be laterally deflected, as will be apparent to those skilled in the art. The rotation maintains contact between element 142 and opening 146, and has substantially no effect on the direction of beam 156. In addition, element 142 may be translated in the z-direction, also maintaining the contact between the element and the opening. Thus, element 142 may be actively aligned, with components mounted on or coupled to bench 143, by three rotational degrees of freedom and one translational degree of freedom. Once aligned, the element may be fixed in place to the bench using the regions of the element contacting opening 146.

It will be appreciated that different configurations of opening 146 may allow zero, one, or two translational degrees of freedom, as well as three rotational degrees of freedom. For example, slit 145 may be configured so that a base of the slit contacts a lower section of surface 149, so as to allow element 142 two translational degrees of freedom. Alternatively or additionally, slit 145 and chamfer 147 may be configured so that the chamfer forms a truncated inverted square pyramid, dimensioned so that all sides of the pyramid contact surface 149, so as to prohibit element 142 from translating. Furthermore, opening 146 may be configured as a hole in its bench. It will be appreciated that such a hole may be a through hole or a non-through hole, having a circular or other closed figure cross-section, and that the hole may comprise a chamfer similar to chamfer 147. All such configurations of opening 146 are assumed to be included within the scope of the present invention.

In an alternative embodiment of the present invention, element 142 is positioned in another opening in optical bench 143, the opening typically being substantially similar to opening 26 or 34 (FIG. 1). In a further alternative embodiment of the present invention, element 142 is positioned on surface 151 of bench 143, substantially as described above with reference to FIG. 2C. Appropriate rotations and/or translations of element 142 may be applied to the element, as described above, for the purposes of alignment.

It will be understood that element 142, having two parallel surfaces, may also act as a Fabry Perot etalon. In some embodiments of the present invention, for example if beam 156 is from a laser, the Fabry Perot etalon may be aligned so that its axis is angled relative to an angle of beam 156, so as to preclude radiation from the etalon reflecting back to the laser.

Figure 5:
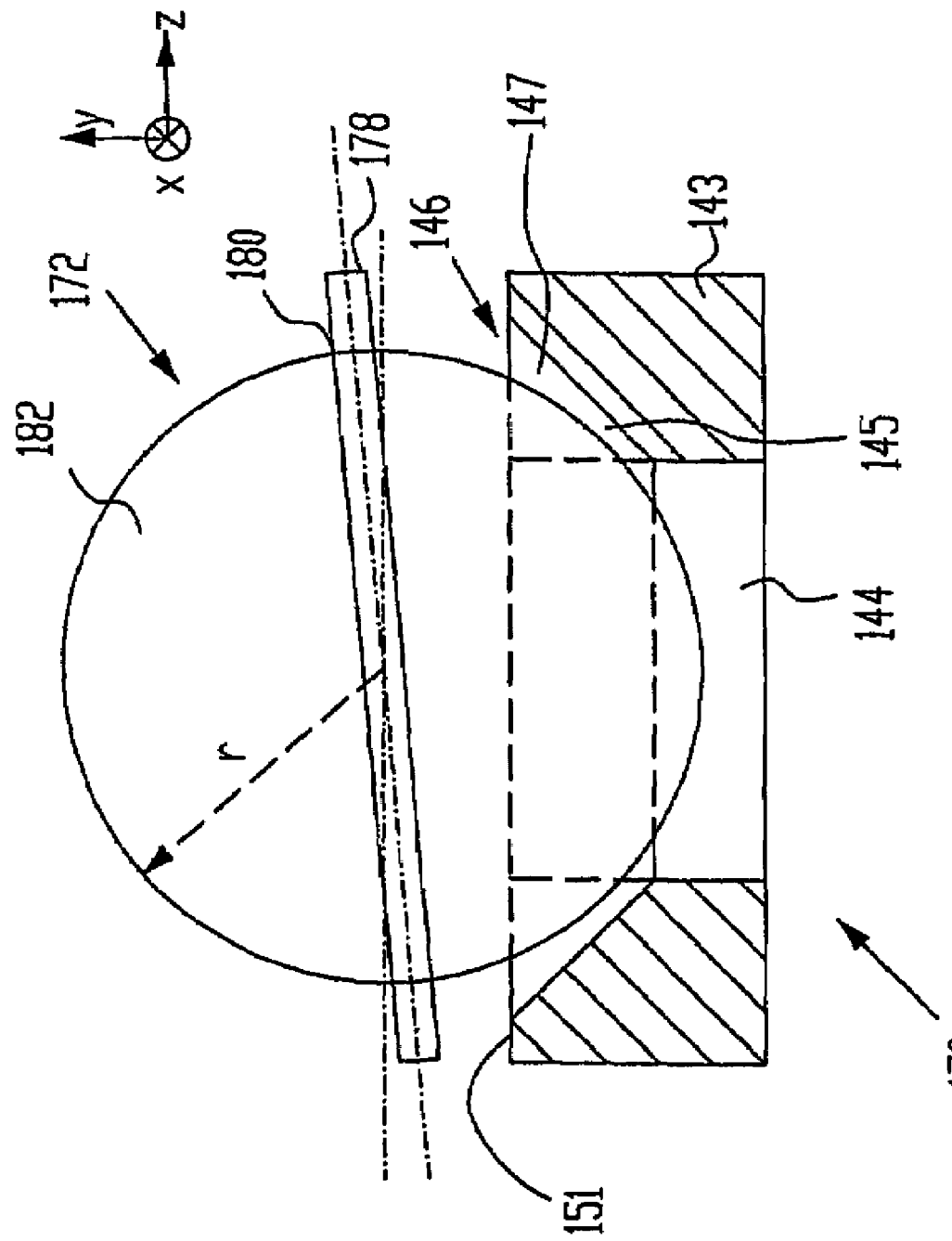
FIG. 5 is a schematic sectional view of a further alternative optical element, according to an embodiment of the present invention.

FIG. 5 is a schematic sectional view 170 of an optical element 172, according to an embodiment of the present invention. Apart from the differences described below, the operation of element 172 is generally similar to that of element 142 (FIG. 4), such that elements indicated by the same reference numerals in views 140 and 170 are generally identical in construction and in operation. Element 172 comprises a substantially spherical ball 182 through which is drilled a hole 180, the hole being adapted to receive a fibre optic 178. Element 172 is positioned in opening 146, substantially as described above for element 142. As described above with reference to FIG. 4 for the plane surfaces of element 142, fibre optic 178 may be aligned with one translational and three rotational degrees of freedom. Fibre optic 178 is fixed in alignment by fixing element 172 to the bench using the regions of element 172 contacting opening 146.

Figure 6:
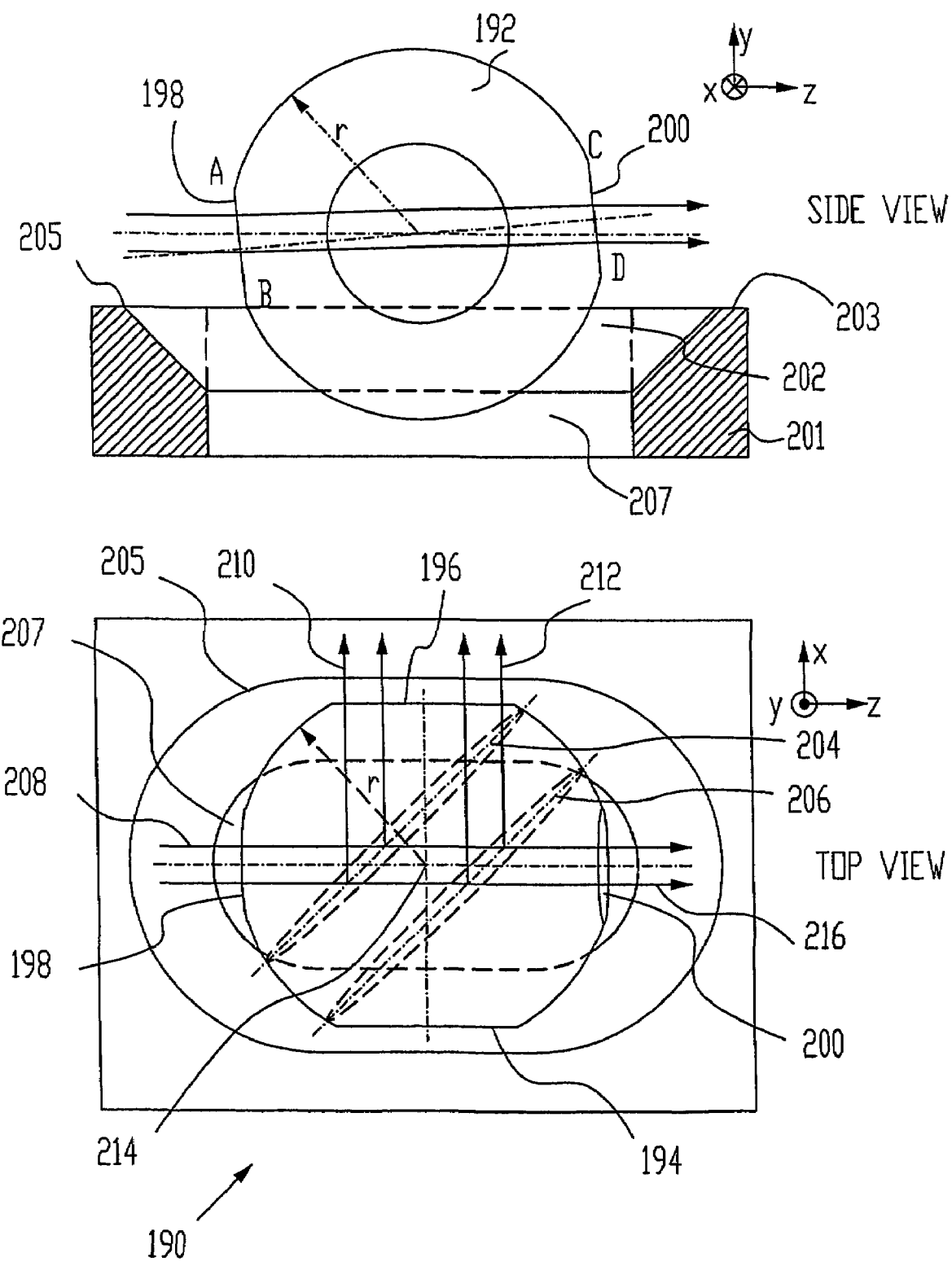
FIG. 6 shows schematic top and side views of a further alternative optical element, according to an embodiment of the present invention.

FIG. 6 shows schematic top and side views of an optical element 190, according to an embodiment of the present invention. Element 190 comprises a generally spherical ball 192. A first pair of substantially parallel planes 198 and 200 are configured on the surface of the ball. A second pair of substantially parallel planes 194 and 196, orthogonal to the first pair of planes, are configured on the surface of the ball. A first and a second internal volume hologram, 204 and 206, are configured within ball 192. By way of example the holograms are assumed to be at 45° to planes 194 and 198, although the angle made by the holograms with the planes may be any suitable angle, in which case the angle between the first and the second pair of planes is modified accordingly, as will be understood by those skilled in the art. Holograms 204 and 206 act as narrow-band beam splitters for different wavelengths incident on the holograms.

A beam 208, incident from the left, is partially reflected as a first outgoing beam 210 through plane 196 by first hologram 204. The beam partially transmitted through hologram 204 is partially reflected as a second outgoing beam 212 from second hologram 206, and is partially transmitted as a third outgoing beam 216 through plane 200. The wavelengths of the partially transmitted or reflected beams depend on the wavelength characteristics of holograms 204 and 206.

Element 190 is mounted in an opening 202 of an optical bench 201. Typically, opening 202 has a form generally similar to slit 145 (FIG. 4), having a chamfer 205 and a through opening 207. Thus, element 190 may be rotated, and then fixedly aligned, with three degrees of freedom about a center 214 of ball 192. The rotations enable beam 216 to be shifted in both x and y directions while remaining parallel to the z direction. The rotations also enable beams 210 and 212 to be deviated angularly relative to all three axes x, y and z. It will thus be appreciated that element 190 acts both as a wavelength and spatial de-multiplexer of incoming beam 208, as well as an alignment element for the three outgoing beams. Alternatively, element 190 may be used as a multiplexer, by reversing the directions of beams 210 and 212. Further alternatively or additionally, holograms 204 and/or 206 may be configured as broadband beam splitters, so that element 192 acts as a simple beam splitter.

It will further be appreciated that if opening 202 has a form substantially similar to opening 34 (FIG. 1), or opening 146 (FIG. 4), more degrees of freedom for adjustment of ball 192 are allowed. Furthermore, ball 192 may be mounted on a surface 203 of bench 201, so that the ball may have three degrees of rotational, and two degrees of translational freedom, as described above with reference to element 78 (FIG. 2C). Once aligned, element 190 may be fixed relative to bench 201 via support regions used in the alignment process, as described hereinabove.

Figure 7:
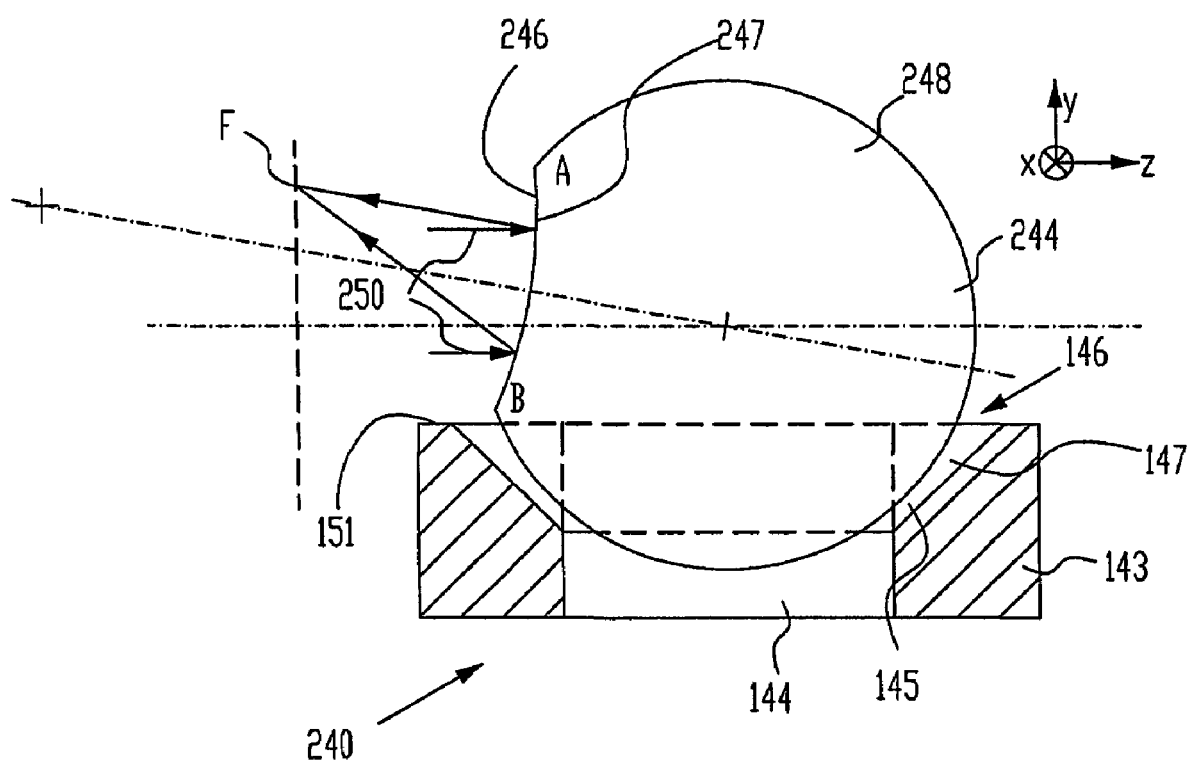
FIG. 7 is a schematic sectional view of yet further optical element, according to an embodiment of the present invention.

FIG. 7 is a schematic sectional view 240 of an optical element 244, according to an embodiment of the present invention. Apart from the differences described below, the operation of element 244 is generally similar to that of element 142 (FIG. 4), such that elements indicated by the same reference numerals in views 140 and 240 are generally identical in construction and in operation. Element 244 is positioned in opening 146. Element 244 comprises a substantially spherical ball 248 upon a surface of which is configured a concave surface 246 which acts as a mirror 247. A collimated beam 250 incident on surface 246 reflects to a focus F. The position of F may be varied by aligning ball 248 by rotation and/or translation relative to opening 146. Such rotation and/or translation allows F to be translated in three dimensions, as well as allowing an angular control over the direction of the outgoing optical beam. It will be appreciated that if mirror 247 is a fully reflecting mirror, there is no requirement that ball 248 be transparent to radiation incident on the mirror. For example, if the incident radiation comprises visible light, ball 248 may be formed from stainless steel.

FIG. 8 depicts schematic sectional side and top views of an optical element 254, according to an embodiment of the present invention. Element 254 comprises a spherical transparent ball that is inserted into an opening 255 in a bench 258, which are typically respectively generally similar to opening 34 in bench 22 (FIG. 1). Opening 255 has trapezoidal sides 251 and 252, which contact a curved surface 253 of element 254.

An opening 256 is formed in element 254, allowing access to an internal optical element 257 in element 254. By way of example, hereinbelow, unless otherwise stated, internal element 257 is assumed to be a mirror. Typically, the mirror is formed when opening 256 is formed. As shown in FIG. 8 by way of example, radiation generally parallel to a surface of bench 258 and incident from the left is first refracted at surface 253, then reflected at the mirror, and finally refracted again at surface 253 to a focal point 259. It will be understood that the incident radiation may alternatively be directed at an angle to the optical bench. The mirror may be aligned by both translation and rotation, substantially as described above for element 35 (FIG. 1).

Alternatively, element 254 is opaque to radiation, and is positioned so that the radiation to and from internal element 257 passes via opening 256 in element 254. It will thus be appreciated that opening 256 may provide access to internal element 257 and/or a path for radiation to and from the element. It will further be appreciated that internal element 257 may comprise substantially any optical element or combination of optical elements, including a reflective element such as a mirror, a refractive element such as a lens, and/or a diffractive element, and that by arranging the internal element within element 254, the internal element may be accessed and aligned as described above.

As illustrated above, optical elements may be aligned, relative to components mounted on an optical bench, by translating and/or rotating the elements while maintaining the elements in contact with the optical bench and/or one or more surfaces of an opening of the optical bench. FIGS. 9-13 below are illustrative of systems that may be used to adjust the optical elements. Systems for such adjustment, other than those described hereinbelow, such as use of a gripper in the form of mechanical tweezers, will be familiar to those skilled in the art. By way of example, some of the systems described with reference to FIGS. 9-13 are assumed to be applied to optical element 78 and its associated supporting elements (FIG. 2B), or to element 142 (FIG. 4), and are identified in FIGS. 9-13 by the same reference numerals as are used in FIGS. 2B and 4.

FIG. 9 shows schematic sectional views of apparatus for gripping an optical element, according to an embodiment of the present invention. In a sectional view 260, a vacuum pickup tool 262 has axial symmetry and has a substantially circular edge 264, most preferably a knife edge, that is used to contact and grip surface 149 by forming a vacuum in a space 266. Forming edge 264 as a knife edge increases the frictional force that may be exerted by edge 264, and so increases the gripping force possible. In addition to gripping the element, during adjustment and alignment of element 142 tool 262 also maintains the element in contact with opening 146.

In a sectional view 270, an optical element 272 is generally similar to element 142, but is truncated by a plane surface 274. Attached to surface 274 is a gripper stem 276. Alternatively, element 272 may be formed with stem 276 integral to the element. Stem 276 is held, for example by mechanical tweezers or by tool 262, so that element 272 may be adjusted and aligned as described above for element 142, and so that element 272 is maintained in contact with opening 146 during the alignment process.

Sectional views 280 and 290 are respectively side and front views of an apparatus 282 for adjusting element 78 and its sectional holder 86. Apparatus 282 comprises a gripper stem 284 which is attached to a bracket 286. Bracket 286 is configured to contact surface 76. During adjustment of sectional holder 86, and consequent alignment of element 78, bracket 286 is maintained in contact with surface 76, and force transmitted via gripper stem 284 and the bracket maintains sectional holder 86 in contact with opening 84.

FIG. 10 shows schematic sectional views illustrating methods for adjusting an optical element, according to an embodiment of the present invention. By way of example, the methods are illustrated for vacuum pickup tool 262 holding element 142 (FIG. 9) in contact with opening 146. Tool 262 may rotate element 142 about center 154 as shown in a section 300; tool 262 may also translate the element. Alternatively or additionally, optical bench 143 may be translated and/or rotated relative to element 142, while tool 262 holds the element stationary, as shown in a section 310. In both cases, tool 262 maintains element 142 in contact with opening 146, while the element translates and/or rotates relatively with respect to the opening.

FIG. 11 is a schematic sectional view 320 illustrating a system 321 for adjusting an optical element, according to an embodiment of the present invention. The following description is directed towards adjustment of an optical element 322 which comprises a spherically curved surface 324 upon which is formed, by way of example, a plane surface 323.

Optical element 322 is assumed to be positioned in an opening 326 in an optical bench 328. Opening 326 is assumed to be shaped generally as opening 26 (FIG. 1), having substantially symmetrical sides 342 which make an angle β with an x-axis. In an embodiment of the invention, bench 328 is comprised of crystalline silicon, and angle β=54° 42'.

Element 322 is held in place in opening 326 by a first and a second actuator 330 and 332. Actuators 330 and 332 are able to apply generally tangential forces to surface 324, so as to induce element 322 to move. Such actuators are known in the art, and typically use a piezo-electric or electrostrictive effect to actuate a head of the actuator to move in a generally elliptical orbit having a plane which may be arbitrarily set. For example, Nanomotion Ltd., of Yokneam, Israel, produce ST-1 actuators which are described as operating by piezoelectricity, and which may advantageously be used as actuators 330 and 332. Other types of actuators, such as surface acoustic wave linear motors, will be apparent to those skilled in the art for use as actuators 330 and 332. It will thus be appreciated that actuators 330 and 332 may comprise any suitable device that is able to apply a generally tangential force to surface 324.

Actuators 330 and 332 are positioned symmetrically about element 322, and an axis of each of the actuators makes an angle α with a y-axis. Forces generated by the actuators, which are typically of the order of 1 N, are typically transferred to element 322 via frictional materials 334 and 336 attached to respective actuators 330 and 332, so that the actuators are able to apply both tangential and normal forces to surface 324. It will be appreciated that normal forces F applied by the actuators maintain element 322 in contact with sides 342 of opening 326. If both actuators also apply tangential forces parallel to a z-axis and in the same direction, then element 322 tends to rotate about the x-axis. Alternatively, if actuators 330 and 332 apply tangential forces parallel to the z-axis, and in opposite directions, element 322 tends to rotate about the y-axis.

In order for the rotations to occur, the frictional forces applied by the actuators, i.e., the tangential forces they apply, must be greater than the frictional forces generated at contact regions 338 and 340 between element 322 and surfaces 342. If the coefficients of friction between element 322 and materials 334, 336 and surfaces 342 are approximately equal, and if the normal forces exerted by the actuators are significantly larger than a weight of element 322, then those skilled in the art will be able to verify that for rotation to occur α>β. In general, it will be appreciated that materials 334 and 336 may be selected to have specific coefficients of friction, and the angles of actuators 330 and 332 may be adjusted, so that rotation of element 322 occurs.

Figure 12:
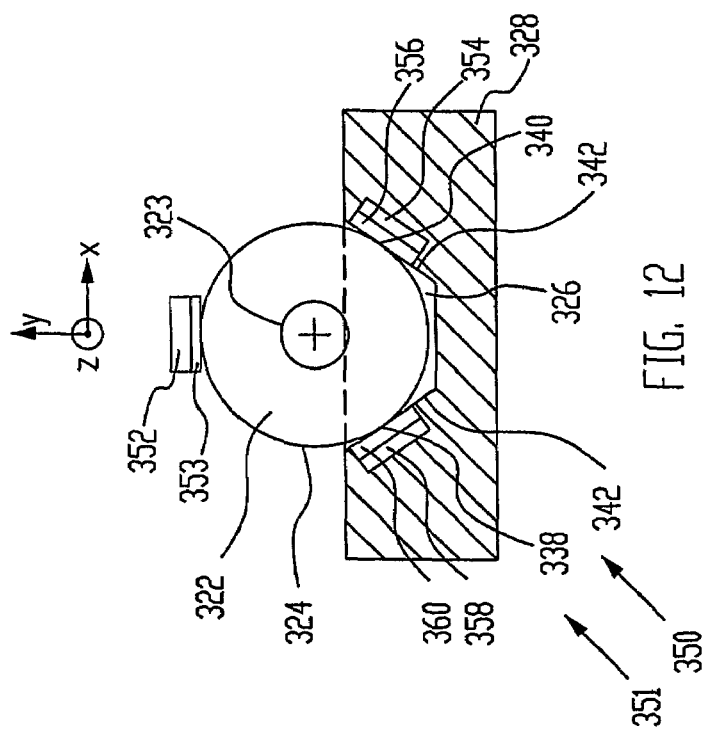
FIG. 12 is a schematic sectional view illustrating an alternative system for adjusting an optical element, according to an embodiment of the present invention.

FIG. 12 is a schematic sectional view 350 illustrating an alternative system 351 for adjusting an optical element, according to an embodiment of the present invention. Apart from the differences described below, the operation of system 351 is generally similar to that of system 321 (FIG. 11), such that elements indicated by the same reference numerals in both systems 321 and 351 are generally identical in construction and in operation. In system 351, actuators 358 and 354 are implemented to apply generally tangential forces to surface 324, and are fixedly attached to, or are embedded in, bench 328, so as to be fixedly coupled to the bench. Alternatively, not shown for reasons of clarity, actuators 358 and 354 are moveably attached to the bench, which typically comprises holes penetrating the bench which allow the actuators access to element 322 so as to contact surface 324. Such attachment, embedding, or access, is typically to sides 342 of opening 326, and enables the actuators to contact optical element 322 directly.

In embodiments using attachment to or embedding in the bench, actuators 358 and 354 are typically implemented from thin film piezo-electric materials; in an embodiment, actuators 358 and 354 are configured generally as surface acoustic wave (SAW) generators. In embodiments using access via holes in the bench, actuators 358 and 354 may typically be generally similar to the actuators described above with reference to FIG. 11, configured to apply generally tangential forces to surface 324. Actuators 358 and 354 are hereinbelow, unless otherwise stated, assumed to be implemented in place of actuators 330 and 332; alternatively, not shown for reasons of clarity, actuators 358 and 354 may be implemented as well as actuators 330 and 332.

Optionally, respective frictional materials 360 and 356 are interposed between element 322 and the actuators 358 and 354. One or more restraining elements 352 are typically placed in contact with surface 324, in positions generally opposite to bench 328, so as to maintain element 322 in contact with the actuators and/or their attached frictional materials. Typically, the one or more restraining elements 352 are passive elements, acting to inhibit unwanted vertical translation of element 322. Alternatively, at least one of the one or more restraining elements 352 may comprise an actuator 353 similar to actuator 358, optionally with an attached frictional material. The attached or embedded actuators, and/or actuators comprised in the one or more restraining elements 352, may be used as described above, with reference to FIG. 11, to rotate optical element 322.

It will be appreciated that if optical element 322 is positioned in an opening which permits translation, such as opening 34 (FIG. 1), actuators 358 and 354, and actuators comprised in the one or more restraining elements 352 (and actuators 330 and/or 332 if present), may be used to rotate and/or translate the optical element in a controlled manner. Thus, by way of example, if element 352 comprises one restraining element having one actuator 353, then it will be appreciated that the three actuators 353, 354, and 358 may generate independent rotations about the x-axis, the y-axis, and the z-axis, and independent translation along the z-axis.

Figure 13:
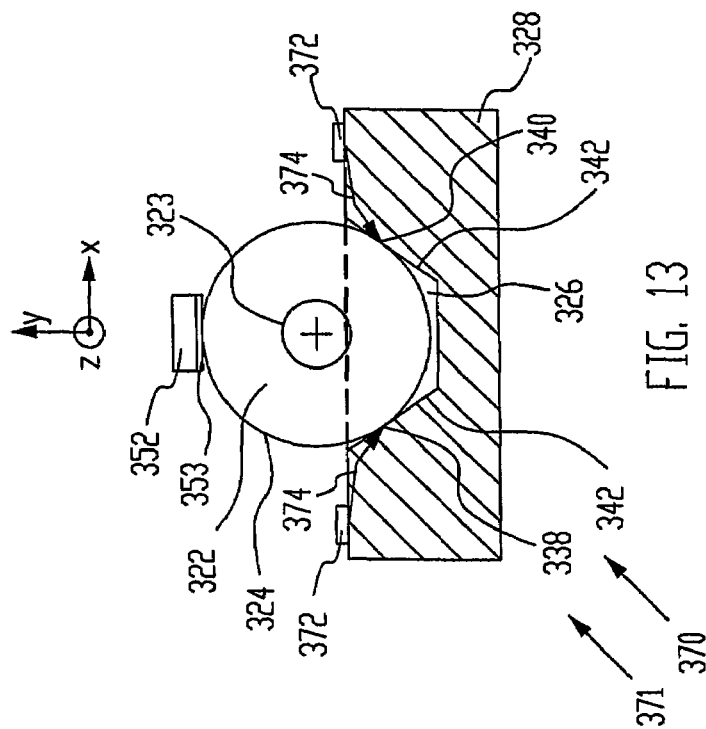
FIG. 13 is a schematic sectional view illustrating a further alternative system for adjusting an optical element, according to an embodiment of the present invention.

FIG. 13 is a schematic sectional view 370 illustrating a further alternative system 371 for adjusting an optical element, according to an embodiment of the present invention. Apart from the differences described below, the operation of system 371 is generally similar to that of system 351 (FIG. 12), such that elements indicated by the same reference numerals in both systems 351 and 371 are generally identical in construction and in operation. System 371 comprises one or more generally similar SAW generators 372, which are moveably or fixedly coupled to bench 328. SAW generators are known in the art, and may typically be implemented from bulk and/or thin film piezo-electric materials. Generators 372 produce surface waves 374 on bench 328 and/or on opening 326, and are configured to generate the waves so that the waves, on contact with surface 324, produce a tangential force at the contact region. Thus, generators 372 are not in direct contact with element 322, but may nevertheless be used, substantially as actuators 354 and 358, to produce tangential forces on element 322. As described above with reference to FIG. 12, if element 352 comprises one actuator 353, system 371 may generate three independent rotations. Furthermore, as also described above, system 371 may generate independent translation, if the opening within which element 322 permits translation.

For systems 321, 351, and 371, and as described in more detail below, after alignment and fixing of element 322 to bench 328 using any one of these systems, or a combination thereof, many of the alignment devices used in the systems may be removed. Such devices comprise actuators 330 and 332 (system 321), actuators 354 and 358 (if these are configured to be moveable in system 351) one or more restraining elements 352 (systems 351 and 371), and generators 372 (system 371), together with any associated frictional materials.

Once alignment has been completed for an optical element having a curved surface contacting an optical bench, or an opening thereof, at one or more regions, the same regions may be used as supports when the element is fixed to the bench. It will be appreciated that, as described above with reference to FIG. 12, the regions may include embedded or fixedly attached actuators and/or associated frictional materials. There are a number of methods known in the art for fixing elements after alignment. For example, both organic and/or inorganic adhesives, the former typically comprising an epoxy resin, the latter typically being formed from a ceramic or a silicate material, may be used. A glass frit may be used to fix the optical element, typically if it is comprised of glass, to a metal, a ceramic, or a semiconductor forming the optical bench. A solder such as a gold-tin alloy may also be used.

Many of the fixing processes require the application of heat, as for example in the case of epoxy resins. Ultra-violet cured resins often generate or absorb significant heat during the curing and fixing process. Thus, in prior art alignment systems, heat application, generation, and/or absorption during fixing of pre-aligned objects typically creates the need for a predetermined offset and/or post-alignment after the fixing. Even if heating is not a problem, fixing materials, such as those exemplified above, typically shrink during fixing, and in prior art alignment systems the shrinkage necessitates the need for the predetermined offset and/or post-alignment.

Embodiments of the present invention remain in an aligned state during fixing, regardless of the fixing process or fixing material used, and regardless of any shrinkage of such materials. The same contact regions—between the optical bench and the optical element or its holder—are used as supporting regions during both alignment and fixing. Thus, shrinkage of the fixing material causes the optical element or its holder to exert a stronger, generally normal, force on the contact region or regions of the optical bench, but the contact prevents movement in the normal direction. Also, heating of the fixing material, and/or heat generation or absorption during fixing, cause the optical element or its holder, and the bench, to move together since the two are in contact.

Furthermore, movement during fixing, in a direction generally tangential to the contact regions, is substantially nullified because of the frictional forces between the optical element or its holder and the optical bench. During alignment, the frictional forces may be controlled according to the type of motion required for the alignment. The frictional forces are a function of the normal forces generated by the adjusting elements, such as gripping tool 262 (FIG. 9), at the contact region or regions. Once alignment has been achieved, the frictional forces may advantageously be increased by increasing the normal forces generated at the contact region or regions, using the adjusting elements. Such increased frictional forces further reduce the chance of any movement during fixing.

While the description above has been directed principally to spherically curved surfaces of elements or sections contacting openings of optical benches, it will be appreciated that the scope of the present invention applies to elements or sections having other forms of curved surfaces, such as aspherical, cylindrical, ellipsoidal or. paraboloidal surfaces. All such curved surfaces are assumed to be included within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for aligning an optical beam relative to an optical bench, comprising:
    rotatably mounting an optical alignment element comprising a curved surface on a mounting surface of said optical bench and in the path of said optical beam, said mounting surface including at least one journal surface that engages at least a portion of said curved surface of said optical alignment element to support said optical alignment element while permitting rotational movement of said optical alignment element;
    aligning said optical beam by controlled rotational movement of said optical alignment element relative to said mounting surface while said journal surface engages said curved surface of said optical alignment element; and
    fixing said optical alignment element to said mounting surface while the curved surface of said optical alignment element is engaged with said journal surface to maintain the alignment achieved by the rotation of said optical alignment element relative to said mounting surface.

2. The method according to claim 1, wherein said curved surface of said optical alignment element has a center of curvature, and wherein said journal surface has a size and shape such as to permit the alignment of said optical beam by rotation of the optical alignment element about said center of curvature of said curved surface.

3. The method according to claim 1, wherein said journal surface has a size and shape that permit the alignment of said optical beam by translation of the optical alignment element while said curved surface is engaged by said journal surface.

4. The method according to claim 1, wherein said optical alignment element performs at least one of refraction, reflection, and diffraction of electromagnetic (EM) radiation incident thereon, and wherein the alignment comprises adjusting a path of said electromagnetic radiation.

5. The method of claim 1 in which said controlled rotational movement is effected by:
    one or more actuators coupled to said optical alignment element.

6. The method according to claim 5, wherein said one or more actuators are embedded in the optical bench.

7. The method according to claim 5, wherein said one or more actuators are attached to the optical bench.

8. The method according to claim 5, wherein said one or more actuators contact said curved surface.

9. The method according to claim 5, wherein said one or more actuators produce surface waves which contact said curved surface.

10. The method according to claim 1, wherein the curved surface is formed by a spherical lens.

11. The method according to claim 10, wherein the spherical lens includes a substantially flat surface that breaks the symmetry of the spherical lens to allow optical alignment by rotation of the spherical lens.

12. The method according to claim 11, wherein both a spherical surface and a flat surface of the lens are in the path of an optical beam passed through the lens.

13. The method according to claim 10, wherein the spherical surface of said lens is in contact with the mounting surface.

14. The method according to claim 10, which includes fixing the spherical surface to the mounting surface while the spherical surface is engaged by the mounting surface.

15. The method of claim 1 which further comprises mounting a second optical alignment element comprising a curved surface on said mounting surface and in said path of said optical beam, said mounting surface forming a second journal surface that engages at least a portion of said curved surface of said second optical alignment element while permitting rotational movement of said second optical alignment element, and which includes aligning said optical beam by controlled rotational movement of said second optical alignment element relative to said mounting surface while said second journal surface engages said curved surface of said second optical alignment element.

16. The method of claim 1 which further comprises attaching to said mounting surface at least one of an optical beam source and an optical beam target for said optical beam.

17. The method of claim 1 in which said optical alignment element is mounted on said mounting surface to also permit translation of said element relative to said mounting surface while said element remains in engagement with said mounting surface.

* * * * *